United States Patent
Jeong (10) Patent No.: US 8,415,700 B2
(45) Date of Patent: Apr. 9, 2013

(54) LIGHT EMITTING DEVICE, METHOD OF MANUFACTURING THE LIGHT EMITTING DEVICE, LIGHT EMITTING DEVICE PACKAGE, AND LIGHTING SYSTEM

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 10 days.

(21) Appl. No.: 13/033,890

(22) Filed: Feb. 24, 2011

(65) Prior Publication Data
US 2011/0204404 A1  Aug. 25, 2011

(30) Foreign Application Priority Data
Apr. 15, 2010 (KR) .................. 10-2010-0034858

(51) Int. Cl.
*H01L 33/00* (2010.01)
(52) U.S. Cl. ............... 257/98; 257/99; 257/E33.072; 257/E33.011
(58) Field of Classification Search ........... 257/E33.011, 257/E33.072, 99, 98
See application file for complete search history.

(56) References Cited

U.S. PATENT DOCUMENTS

| 7,156,538 B2* | 1/2007 | Han et al. .............. 362/249.06 |
| 7,253,445 B2* | 8/2007 | Heremans et al. .............. 257/95 |
| 2008/0006836 A1* | 1/2008 | Lee ............................. 257/98 |
| 2009/0309126 A1 | 12/2009 | Okuno ........................ 257/103 |

FOREIGN PATENT DOCUMENTS

| JP | 2008-60331 A | 3/2008 |
| KR | 10-2005-0096741 A | 10/2005 |

* cited by examiner

*Primary Examiner* — Julio J. Maldonado
*Assistant Examiner* — Amar Movva
(74) *Attorney, Agent, or Firm* — KED & Associates, LLP (57) ABSTRACT

Provided is a light emitting device. The light emitting device includes a conductive support substrate, an ohmic contact layer, a current blocking layer, a light emitting structure layer, an electrode, and a first current guide layer. The ohmic contact layer and the current blocking layer are disposed on the conductive support substrate. The light emitting structure layer is disposed on the ohmic contact layer and the current blocking layer. The electrode is disposed on the light emitting structure layer. At least a part of the electrode is overlapped with the current blocking layer. The first current guide layer is disposed between the current blocking layer and the conductive support substrate. At least a part of the first current guide layer is overlapped with the current blocking layer.

19 Claims, 12 Drawing Sheets

LIGHT EMITTING DEVICE, METHOD OF MANUFACTURING THE LIGHT EMITTING DEVICE, LIGHT EMITTING DEVICE PACKAGE, AND LIGHTING SYSTEM

CROSS-REFERENCE TO RELATED APPLICATIONS

The present application claims priority of Korean Patent Application No. 10-2010-0034858 filed on Apr. 15, 2010, which is hereby incorporated by reference in its entirety.

BACKGROUND

The present disclosure relates to a light emitting device, a method of manufacturing a light emitting device, a light emitting device package, and a lighting system.

Light emitting diodes (LED) are semiconductor devices that convert electric energy into light. LEDs are more advantageous in many respects such as low power consumption, a semi-permanent life cycle, a fast response time, safety, and eco-friendly characteristics than light sources of the related art such as a fluorescent lamp and an incandescent bulb. Many studies have been conducted to replace existing light sources with LEDs, and LEDs are being increasingly used as light sources of lighting devices such as indoor and outdoor lamps, liquid crystal displays, electronic boards, and streetlights

SUMMARY

Embodiments provide a light emitting device, a method of manufacturing the light emitting device, a light emitting device package, and a lighting system.

Embodiments also provide a light emitting device having a new structure, a method of manufacturing the light emitting device, a light emitting device package, and a lighting system.

In one embodiment, a light emitting device includes: a conductive support substrate; an ohmic contact layer and a current blocking layer on the conductive support substrate; a light emitting structure layer on the ohmic contact layer and the current blocking layer; an electrode disposed on the light emitting structure layer, at least a part of the electrode being overlapped with the current blocking layer; and a current guide layer disposed between the current blocking layer and the conductive support substrate, at least a part of the current guide layer being overlapped with the current blocking layer.

In another embodiment, a light emitting device includes: a conductive support substrate; a protection layer disposed on a peripheral region of the conductive support substrate; a light emitting structure layer disposed on a part of the protection layer and the conductive support substrate; and a current guide layer disposed between the conductive support substrate and the protection layer and spaced apart from the protection layer, at least a part of the current guide layer being overlapped with the protection layer.

In further another embodiment, a light emitting device package including: a package body; first and second electrode layer on the package body; and a light emitting device electrically connected to the first and second electrode layers, wherein the light emitting device comprises: a conductive support substrate; an ohmic contact layer and a current blocking layer on the conductive support substrate; a light emitting structure layer on the ohmic contact layer and the current blocking layer; an electrode disposed on the light emitting structure layer, at least a part of the electrode being overlapped with the current blocking layer; and a current guide layer disposed between the current blocking layer and the conductive support substrate, at least a part of the current guide layer being overlapped with the current blocking layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, with reference to the accompanying drawings, a light emitting device, a method of manufacturing the light emitting device, and a light emitting device package will be described according to exemplary embodiments.

Figure 1:
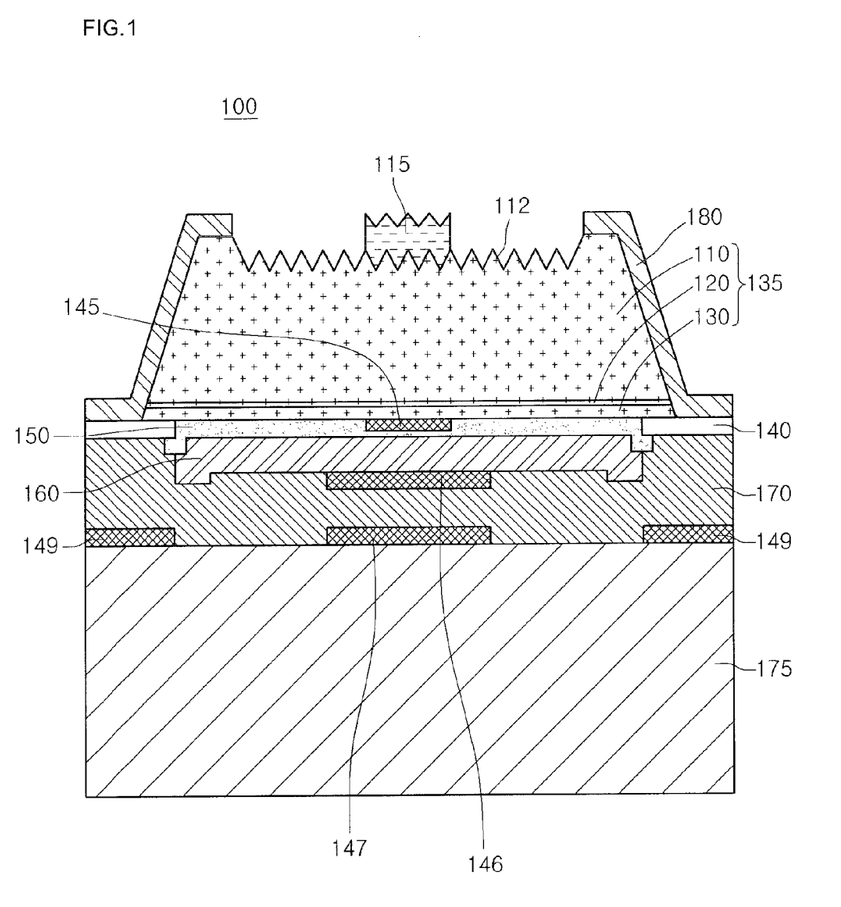
FIG. 1 is a view illustrating a light emitting device according to a first embodiment.

FIG. 1 is a view illustrating a light emitting device 100 according to a first embodiment.

Referring to FIG. 1, according to the first embodiment, the light emitting device 100 includes a conductive support substrate 175, an adhesive layer 170 on the conductive support substrate 175, a reflection layer 160 on the adhesive layer 170, an ohmic contact layer 150 on the reflection layer 160, a protection layer 140 along the top edge of the adhesive layer 170, a light emitting structure layer 135 disposed on the ohmic contact layer 150 and the protection layer 140 to emit light, and an electrode 115 on the light emitting structure layer 135.

In addition, the light emitting device 100 includes: a current blocking layer (CBL) 145 between the light emitting structure layer 135 and the ohmic contact layer 150; and first and second current guide layers 146 and 147 disposed under the current blocking layer 145 at a predetermined distance from the current blocking layer 145 to reduce concentration of a current at the edge of the current blocking layer 145.

The first current guide layer 146 is disposed between the reflection layer 160 and the adhesive layer 170, and the second current guide layer 147 is disposed between the adhesive layer 170 and the conductive support substrate 175. Both or only one of the first and second current guide layers 146 and 147 may be formed.

At least a part of the first current guide layer 146 may be overlapped with the current blocking layer 145 in a vertically direction, and at least a part of the second current guide layer 147 may be overlapped with the current blocking layer 145 and/or the first current guide layer 146 in a vertical direction.

Figure 15:
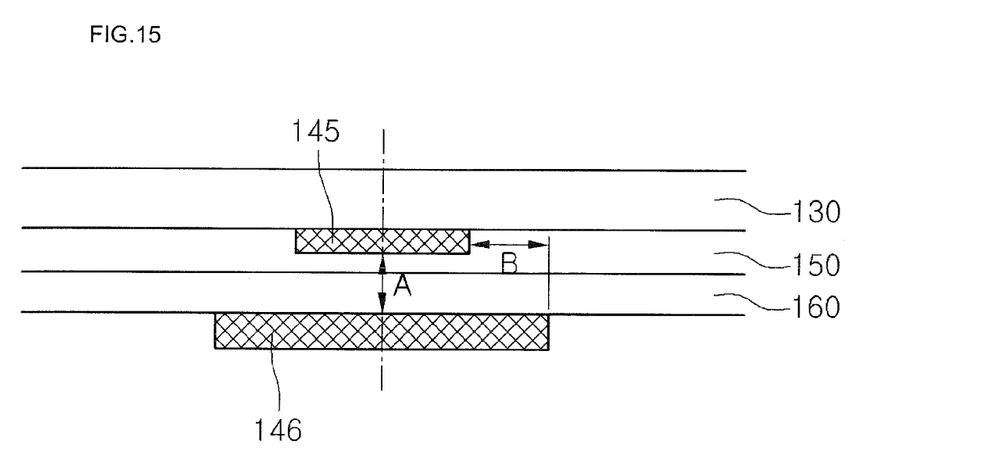
FIG. 15 is a view illustrating a positional relationship between a current blocking layer and a first current guide layer.

FIG. 15 is a view illustrating an exemplary positional relationship between the current blocking layer 145 and the first current guide layer 146. The first current guide layer 146 may be wider than the current blocking layer 145 to effectively prevent concentration of a current at the edge of the current blocking layer 145. For example, a horizontal distance (B) between the edge of the first current guide layer 146 and the edge of the current blocking layer 145 may be adjusted to be greater than a distance (A) between the first current guide layer 146 and the current blocking layer 145. The exemplary positional relationship between the current blocking layer 145 and the first current guide layer 146 shown in FIG. 15 may be applied to the second current guide layer 147, a fourth current guide layer 148 (described later), or a fifth current guide layer 148a (described later).

A third current guide layer 149 is disposed under the protection layer 140 at a predetermined distance from the protection layer 140 to prevent concentration of a current at the edge of the protection layer 140. At least a part of the third current guide layer 149 may be overlapped with the protection layer 140 in a vertical direction. In the embodiment, for example, the third current guide layer 149 is disposed between the adhesive layer 170 and the conductive support substrate 175.

The conductive support substrate 175 may support the light emitting structure layer 135 and supply power to the light emitting structure layer 135 together with the electrode 115. The conductive support substrate 175 may include at least one of copper (Cu), gold (Au), nickel (Ni), molybdenum (Mo), Cu—W, and a carrier wafer (formed of a material such as Si, Ge, GaAs, GaN, ZnO, SiGe, SiC, and $Ga_2O_3$).

The thickness of the conductive support substrate 175 may be varied according to the design of the light emitting device 100. For example, the thickness of the conductive support substrate 175 may be in the range from about 30 μm to about 500 μm.

The adhesive layer 170 may be disposed on the conductive support substrate 175. The adhesive layer 170 is a bonding layer disposed under the reflection layer 160 and the protection layer 140. The adhesive layer 170 is bonded to the reflection layer 160, the ohmic contact layer 150, and the protection layer 140 so that the reflection layer 160, the ohmic contact layer 150, and the protection layer 140 can be securely bonded to the conductive support substrate 175.

The adhesive layer 170 may include a barrier or bonding metal. For example, the adhesive layer 170 may include at least one of Ti, Au, Sn, Ni, Cr, Ga, In, Bi, Cu, Ag, and Ta.

The reflection layer 160 is disposed on the adhesive layer 170. The reflection layer 160 reflects light incident from the light emitting structure layer 135 so that light extraction efficiency can be increased.

For example, the reflection layer 160 may be formed of a metal or alloy including at least one of Ag, Ni, Al, Rh, Pd, Ir, Ru, Mg, Zn, Pt, Au, and Hf. In addition, the reflection layer 160 may be formed in a multi-layer structure using the foregoing metal or alloy and a transparent conductive material such as IZO, IZTO, IAZO, IGZO, IGTO, AZO, and ATO. For example, the reflection layer 160 may have a stacked structure such as IZO/Ni, AZO/Ag, IZO/Ag/Ni, and AZO/Ag/Ni.

In the embodiment, the top surface of the reflection layer 160 makes contact with the ohmic contact layer 150. However, alternatively, the reflection layer 160 may make contact with the protection layer 140, the current blocking layer 145, or the light emitting structure layer 135. That is, the ohmic contact layer 150 may not formed, and the reflection layer 160 may make contact with a second conductive type semiconductor layer 130. In this case, the reflection layer 160 may be formed of a material that can make ohmic contact with the second conductive type semiconductor layer 130.

The ohmic contact layer 150 is formed on the reflection layer 160. The ohmic contact layer 150 may make ohmic contact with the second conductive type semiconductor layer 130 so that power can be smoothly supplied to the light emitting structure layer 135. The ohmic contact layer 150 may include at least one of ITO, IZO, IZTO, IAZO, IGZO, IGTO, AZO, and ATO.

The ohmic contact layer 150 may selectively include a transparent conductive layer and a metal. For example, the ohmic contact layer 150 may be formed into a single-layer structure or a multilayer structure by using at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, and Ni/$IrO_x$/Au/ITO.

In the embodiment, the ohmic contact layer 150 makes contact with the bottom surface and side surface of the current blocking layer 145. However, alternatively, the ohmic contact layer 150 may be spaced apart from the current blocking layer 145 or may make contact with only the side surface of the current blocking layer 145.

The current blocking layer 145 may be disposed between the ohmic contact layer 150 and the second conductive type semiconductor layer 130. The top surface of the current blocking layer 145 may make contact with the second conductive type semiconductor layer 130, and the bottom surface and side surface of the current blocking layer 145 may make contact with the ohmic contact layer 150.

At least a part of the current blocking layer 145 may be overlapped with the electrode 115 in a vertical direction to reduce concentration of a current along the shortest path between the electrode 115 and the conductive support substrate 175, thereby improving the light emitting efficiency of the light emitting device 100.

The current blocking layer 145 may be formed of a material less conductive than the reflection layer 160 or the ohmic contact layer 150, a material capable of making Schottky contact with the second conductive type semiconductor layer 130, or an electrically insulating material. For example, the current blocking layer 145 may include at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al, and Cr.

The protection layer 140 may be formed along the top edge of the adhesive layer 170. The protection layer 140 may be formed between top edge parts of the light emitting structure layer 135 and the adhesive layer 170 by using an electrically insulating material such as ZnO or SiO$_2$. A part of the protection layer 140 is overlapped with the light emitting structure layer 135 in a vertical direction.

Owning to the protection layer 140, the lateral distance between the adhesive layer 170 and an active layer 120 can be increased. Therefore, the possibility of a short circuit may be decreased between the adhesive layer 170 and the active layer 120.

In addition, when isolation etching is performed to separate the light emitting structure layer 135 as a unit chip in a chip separation process, the protection layer 140 prevents a short circuit that may be caused by particles generated from the adhesive layer 170 and attached between the second conductive type semiconductor layer 130 and the active layer 120 or between the active layer 120 and a first conductive type semiconductor layer 110. The protection layer 140 is formed of a material that does not break or generates particles or an electrically insulating material that does not cause a short circuit although it breaks or generates a small amount of particles.

The current blocking layer 145 and the protection layer 140 are disposed on a current path to change the current path. Therefore, a flow of current may concentrate at the edges of the current blocking layer 145 and the protection layer 140 to decrease the performance of the light emitting device 100. Therefore, the light emitting device 100 of the current embodiment includes the first current guide layer 146, the second current guide layer 147, and the third current guide layer 149 to reduce a current flowing in the arranged direction of the current blocking layer 145 and the protection layer 140. Therefore, concentration of a current can be reduced at the edges of the current blocking layer 145 and the protection layer 140.

The first current guide layer 146 and the second current guide layer 147 may be formed of a material having a resistivity of about $5 \times 10^{-4}$ Ωm. For example, the first current guide layer 146 and the second current guide layer 147 may be formed of an electrically insulating material such as ZnO or SiO$_2$. The third current guide layer 149 may be formed of a material having a resistivity of about $5 \times 10^{-4}$ Ωm. For example, the third current guide layer 149 may be formed of an electrically insulating material such as ZnO or SiO$_2$.

Each of the first current guide layer 146 and the second current guide layer 147 may have a thickness in the range from about 5 nm to about 100 μm, and a width equal to or greater than that of the current blocking layer 145. The third current guide layer 149 may have a thickness in the range from about 5 nm to about 100 μm, and a width equal to or greater than that of the protection layer 140.

The light emitting structure layer 135 may be disposed on the ohmic contact layer 150 and the protection layer 140.

In an isolation etching process for separating the light emitting structure layer 135 as a unit chip, the side surface of the light emitting structure layer 135 may be sloped, and a part of the sloped surface is overlapped with the protection layer 140 and the third current guide layer 149 in a vertical direction.

The top surface of the protection layer 140 may be partially exposed by the isolation etching process. Therefore, a part of the protection layer 140 is overlapped with the light emitting structure layer 135 in a vertical direction but the other part of the protection layer 140 is not overlapped with the light emitting structure layer 135 in the vertical direction.

The light emitting structure layer 135 may include a plurality of group III-V compound semiconductor layers. For example, the light emitting structure layer 135 may include the first conductive type semiconductor layer 110, the active layer 120 under the first conductive type semiconductor layer 110, and the second conductive type semiconductor layer 130 under the active layer 120.

For example, the first conductive type semiconductor layer 110 may include an n-type semiconductor layer. The n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as InAlGaN, GaN, AlGaN, AlInN, InGaN, AlN, and InN. The n-type semiconductor layer may be doped with an n-type dopant such as Si, Ge, and Sn. The first conductive type semiconductor layer 110 may be formed in a single-layer or multilayer structure, but is not limited thereto.

The active layer 120 may be formed under the first conductive type semiconductor layer 110 and have at least one of a single quantum well structure, a multi quantum well (MQW) structure, a quantum dot structure, and a quantum wire structure. The active layer 120 may be formed of a semiconductor material having a compositional formula of $In_xAl_yGa_{1-x-y}N$ ($0 \leq x \leq 1$, $0 \leq y \leq 1$, $0 \leq x+y \leq 1$). If the active layer 120 has a multi quantum well structure, the active layer 120 may be formed by stacking a plurality of well layers and a plurality of barrier layers. For example, the active layer 120 may have periods of InGaN well layer/GaN barrier layer.

A doped clad layer (not shown) doped with an n-type or p-type dopant may be disposed above/below the active layer 120. The clad layer (not shown) may include an AlGaN layer or an InAlGaN layer.

The second conductive type semiconductor layer 130 may be formed under the active layer 120 and may include a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$) such as InAlGaN, GaN, AlGaN, InGaN, AlN, InN, or AlInN. Also, the p-type semiconductor layer may be doped with the p-type dopant such as Mg, Zn, Ca, Sr, and Ba.

The second conductive type semiconductor layer 130 may be formed in a single-layer or multilayer structure, but is not limited thereto.

Unlike the above description, in the light emitting structure layer 135, the first conductive type semiconductor layer 110 may include a p-type semiconductor layer, and the second conductive type semiconductor layer 130 may include an n-type semiconductor layer. In addition, a third conductive type semiconductor layer (not shown) including an n-type or p-type semiconductor layer may be formed under the second conductive type semiconductor layer 130, and the light emitting structure layer 135 may have one of a np junction structure, an pn junction structure, a npn junction structure, and an pnp junction structure. In addition, the first conductive type semiconductor layer 110 and the second conductive type semiconductor layer 130 may be doped with conductive type dopants uniformly or non-uniformly That is, the light emitting structure layer 135 may be formed into various structures but not limited thereto.

The electrode 115 is disposed on the light emitting structure layer 135. The electrode 115 may include a pad part and a branch part extending from the pad part. The branch part may branch off from the pad part in a predetermined pattern shape. The branch part may have various shapes.

A rough pattern 112 may be formed on the top surface of the first conductive type semiconductor layer 110 for increasing light extraction efficiency. A rough pattern may also be formed on the top surface of the electrode 115. However, the spirit and scope of the present disclosure is not limited thereto.

A passivation layer 180 may be disposed at least on the side surface of the light emitting structure layer 135. The passivation layer 180 may be formed on the top surfaces of the first conductive type semiconductor layer 110 and the protection layer 140, but not limited thereto.

The passivation layer 180 may be formed to electrically protect the light emitting structure layer 135. For example, the passivation layer 180 may be formed of $SiO_2$, $SiO_x$, $SiO_xN_y$, $Si_3N_4$, or $Al_2O_3$, but not limited thereto.

Hereinafter, a method of manufacturing the light emitting device 100 will be described in detail according to an embodiment. In the following description, the same description as above will be omitted or briefly given.

FIGS. 2 to 11 are views for explaining a method of manufacturing a light emitting device according to the first embodiment.

Figure 2:
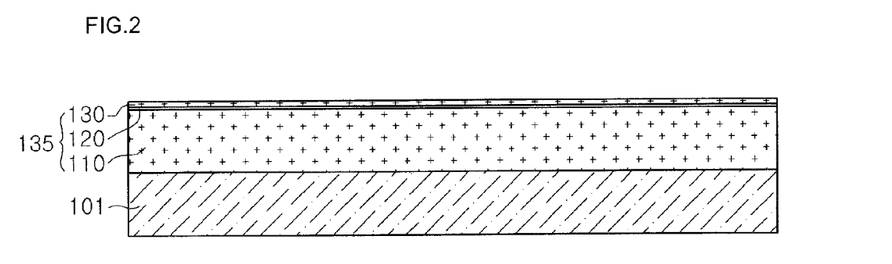
FIGS. 2 to 11 are views for explaining a method of manufacturing a light emitting device according to the first embodiment.

Referring to FIG. 2, a light emitting structure layer 135 is formed on a substrate 101. The substrate 101 may be formed of at least one of $Al_2O_3$ (sapphire), SiC, GaAs, GaN, ZnO, GaP, InP, and Ge, but not limited thereto.

The light emitting structure layer 135 may be formed on the substrate 101 by growing a first conductive type semiconductor layer 110, an active layer 120, and a second conductive type semiconductor layer 130.

The light emitting structure layer 135 may be formed by a method such as a metal organic chemical vapor deposition (MOCVD) method, a chemical vapor deposition (CVD) method, a plasma-enhanced chemical vapor deposition (PECVD), a molecular beam epitaxy (MBE) method, or a hydride vapor phase epitaxy (HVPE) method. However, the method of forming the light emitting structure layer 135 is not limited thereto.

A buffer layer (not shown) and/or an undoped nitride layer (not shown) may be between the light emitting structure layer 135 and the substrate 101 to reduce a lattice constant difference.

Figure 3:
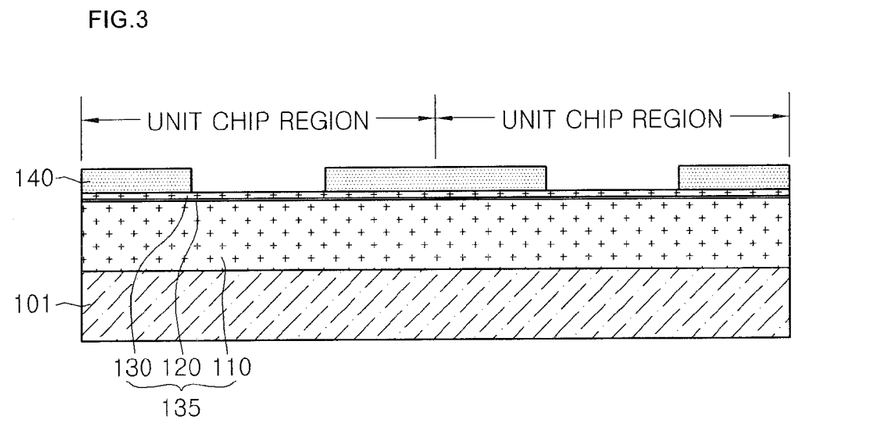

Referring to FIG. 3, a protection layer 140 is selectively formed in unit chip regions of the light emitting structure layer 135.

The protection layer 140 may be formed along the peripheral regions of the unit chip regions by using a mask pattern. The protection layer 140 may be formed by various deposition methods such as a sputtering method.

Figure 4:
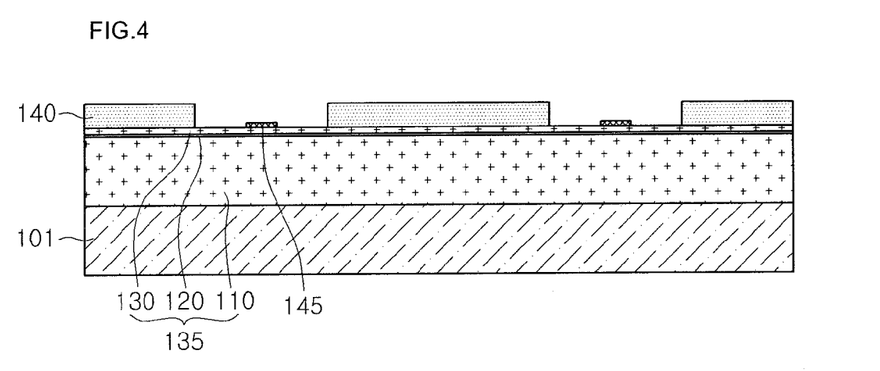

Referring to FIG. 4, a current blocking layer 145 may be formed on the second conductive type semiconductor layer 130. The current blocking layer 145 may be formed by a mask pattern.

The protection layer 140 and the current blocking layer 145 may be formed of the same material. In this case, the protection layer 140 and the current blocking layer 145 may be formed through the same process instead of forming them through separate processes. For example, after a $SiO_2$ layer is formed on the second conductive type semiconductor layer 130, the protection layer 140 and the current blocking layer 145 may be simultaneously formed using a mask pattern.

Figure 5:
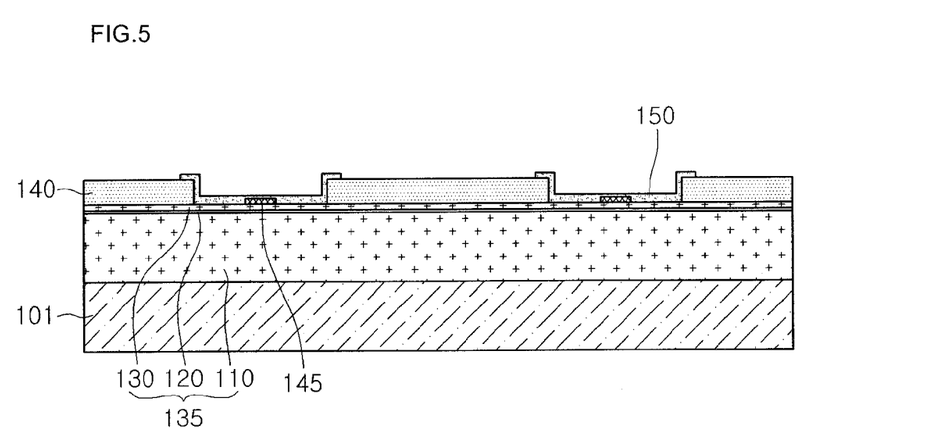
Figure 6:
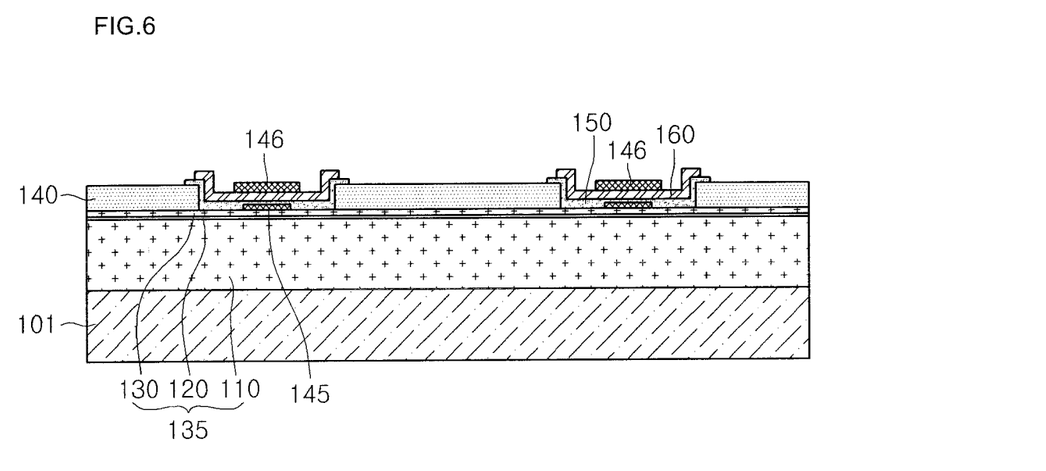

Referring to FIGS. 5 and 6, an ohmic contact layer 150 may be formed on the second conductive type semiconductor layer 130 and the current blocking layer 145, and a reflection layer 160 may be formed on the ohmic contact layer 150.

For example, the ohmic contact layer 150 and the reflection layer 160 may be formed by one of an E-beam deposition method, a sputtering method, and a PECVD method.

Thereafter, a first current guide layer 146 is formed on the reflection layer 160.

Figure 7:
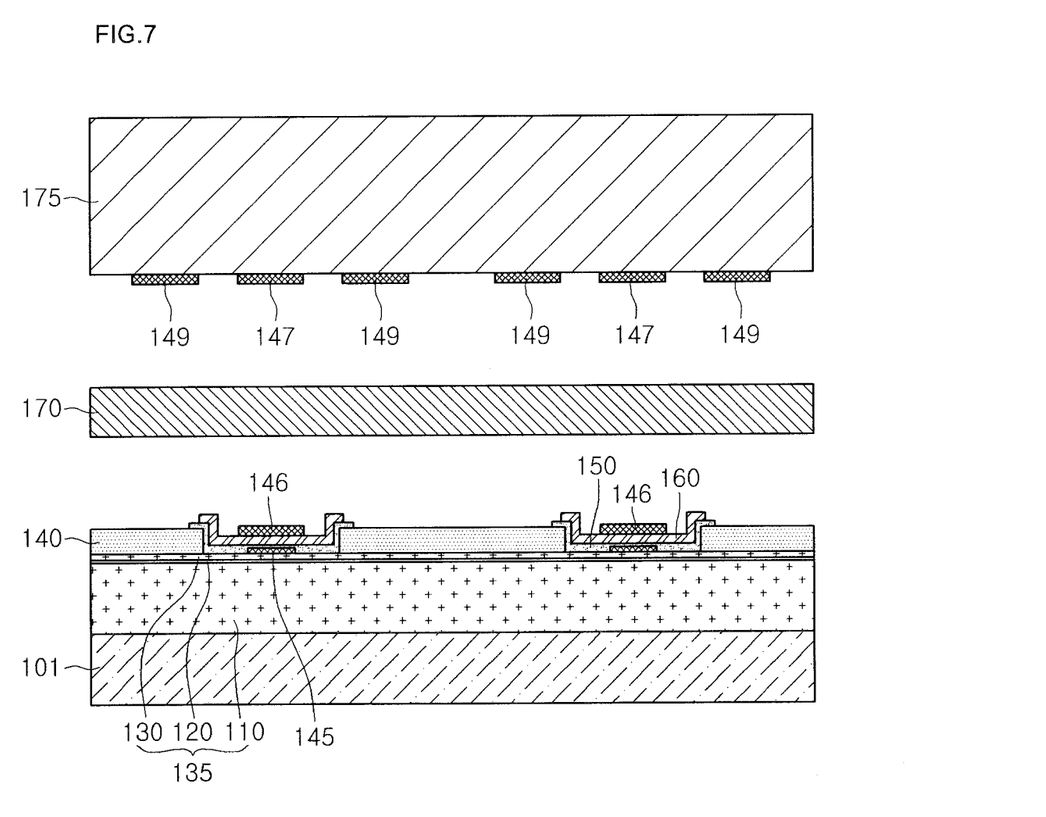
Figure 8:
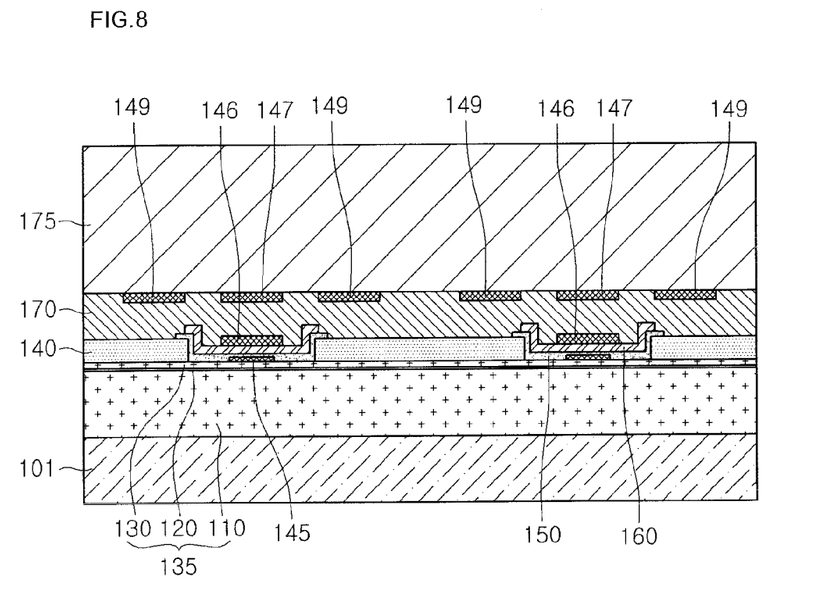

Referring to FIGS. 7 and 8, a conductive support substrate 175 is prepared, and a second current guide layer 147 and a third current guide layer 149 are formed on the conductive support substrate 175.

Next, the structure shown in FIG. 6 and the conductive support substrate 175 are bonded together by using an adhesive layer 170.

The adhesive layer 170 may be brought into contact with the reflection layer 160, ends of the ohmic contact layer 150, and the protection layer 140 to enhance bonding. In addition, the adhesive layer 170 makes contact with the first current guide layer 146, the second current guide layer 147, the third current guide layer 149 so the bonding between the first current guide layer 146 and the reflection layer 160 and the bonding among the second current guide layer 147, the third current guide layer 149, and the conductive support substrate 175 can be secured.

The conductive support substrate 175 is bonded by the adhesive layer 170. In the embodiment, the conductive support substrate 175 is coupled by a bonding method using the adhesive layer 170. However, the conductive support substrate 175 may be formed by other methods such as a plating method and a deposition method.

Figure 9:
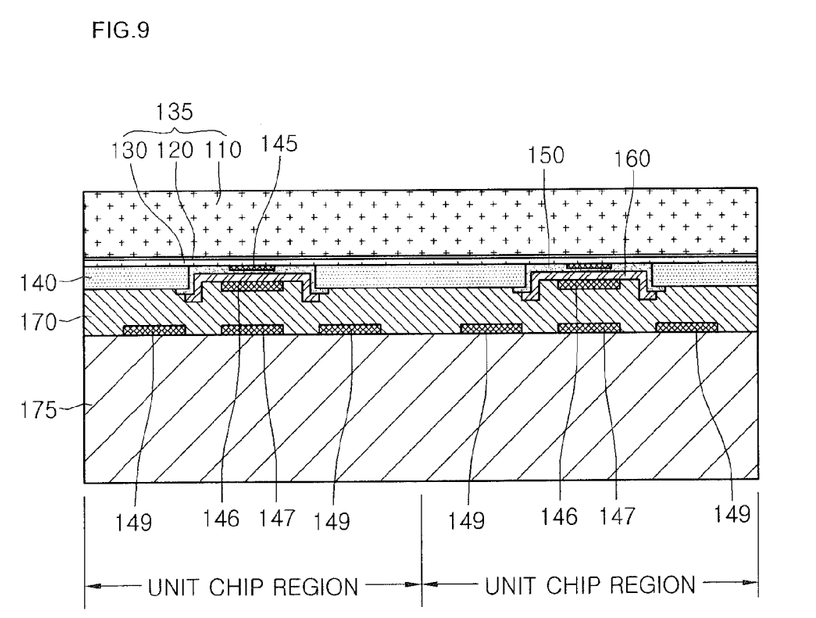

Referring to FIG. 9, the substrate 101 is removed from the light emitting structure layer 135. The structure of FIG. 8 is shown upside down in FIG. 9.

The substrate 101 may be removed by a laser-lift-off method or a chemical-lift-off method.

Figure 10:
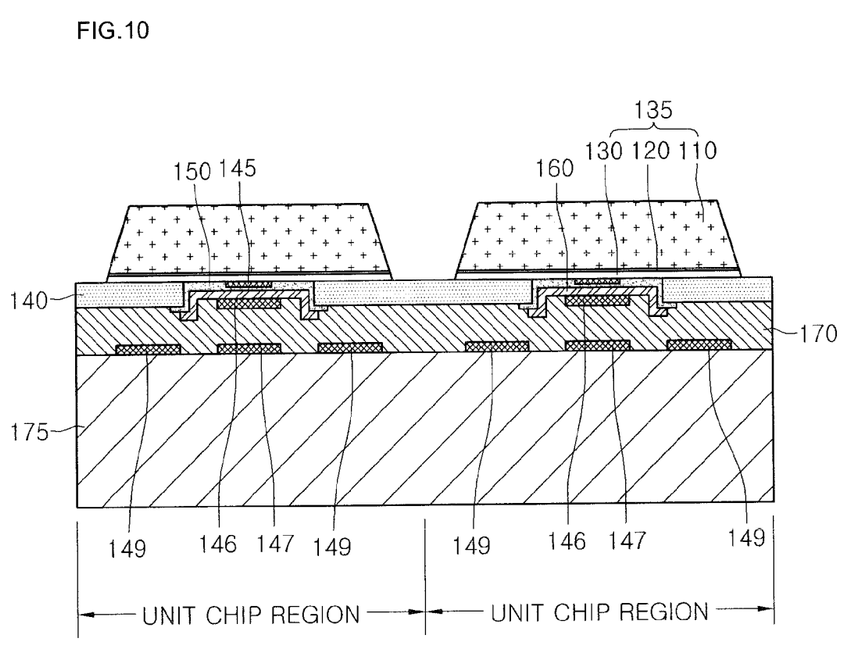

Referring to FIG. 10, an isolation etching process is performed along the boundaries of the unit chip regions to separate the light emitting structure layer 135 into a plurality of parts. For example, the isolation etching process may be performed by a dry etching method using inductively coupled plasma (ICP).

Figure 11:
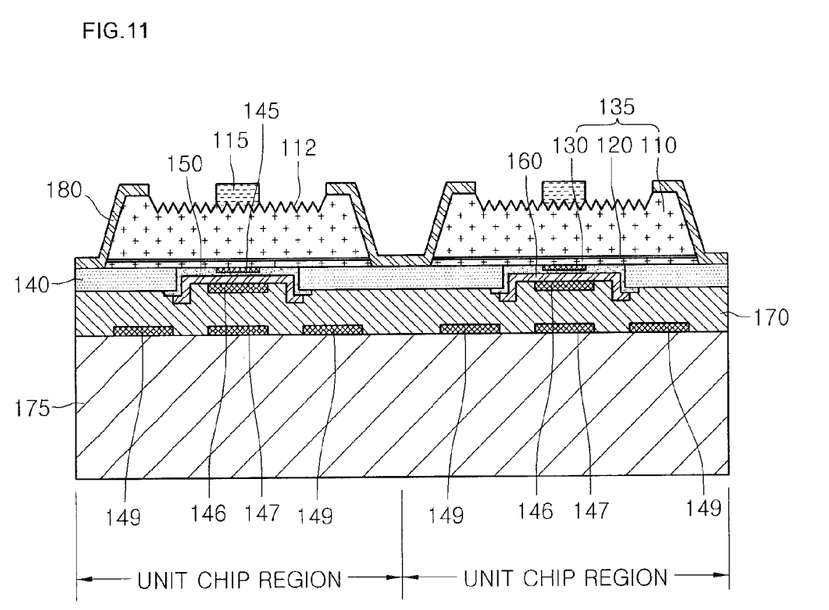

Referring to FIG. 11, a passivation layer 180 is formed on the protection layer 140 and the light emitting structure layer 135, and the passivation layer 180 is selectively removed to expose top surfaces of the first conductive type semiconductor layer 110.

Next, roughness patterns 112 are formed on the top surfaces of the first conductive type semiconductor layer 110 to improve light extraction efficiency, and electrodes 115 are formed on the roughness patterns 112. The roughness patterns 112 may be formed through a wet etching process or a dry etching process.

Then, the structure is separated into unit chips through a chip separation process. In this way, a plurality of light emitting devices can be manufactured.

Examples of the chip separation process include a breaking process in which chips are separated by using a blade, a laser scribing process in which chips are separated by casting a laser beam to chip boundaries, and an etching process such as a wet or dry etching process. However, the chip separation process is not limited thereto.

Figure 12:
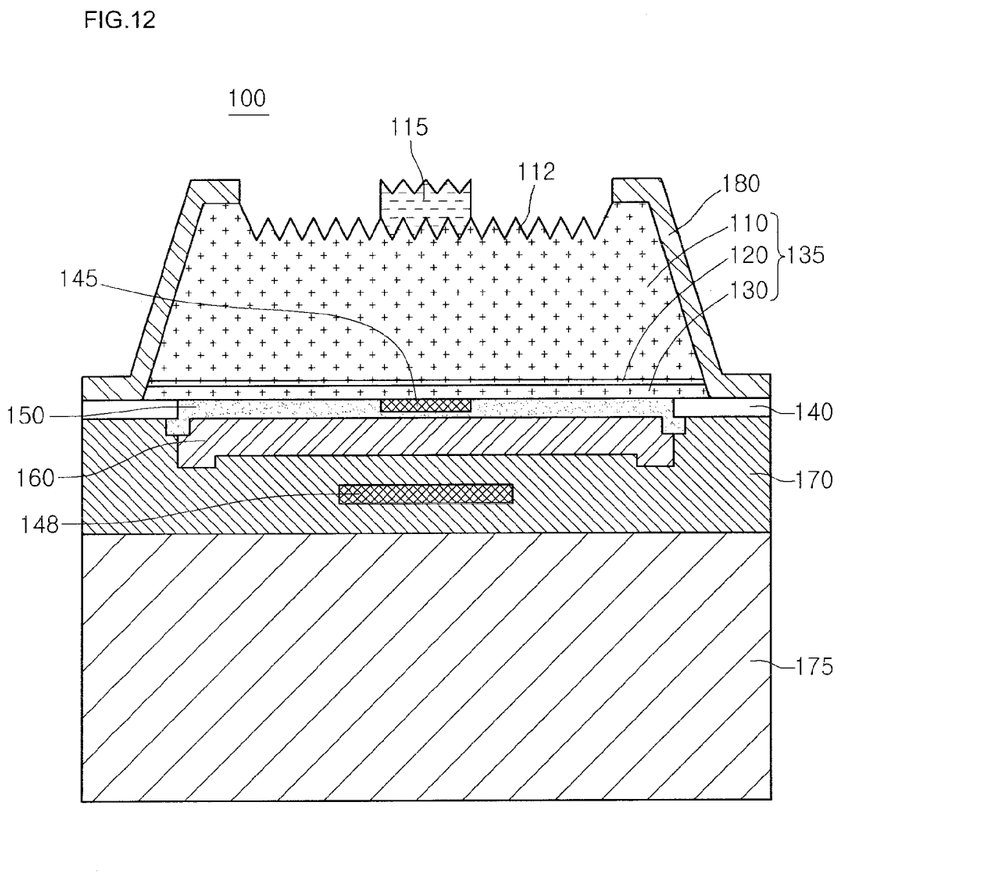
FIGS. 12 and 13 are views for explaining a light emitting device and a method of manufacturing the light emitting device according to a second embodiment.
Figure 13:
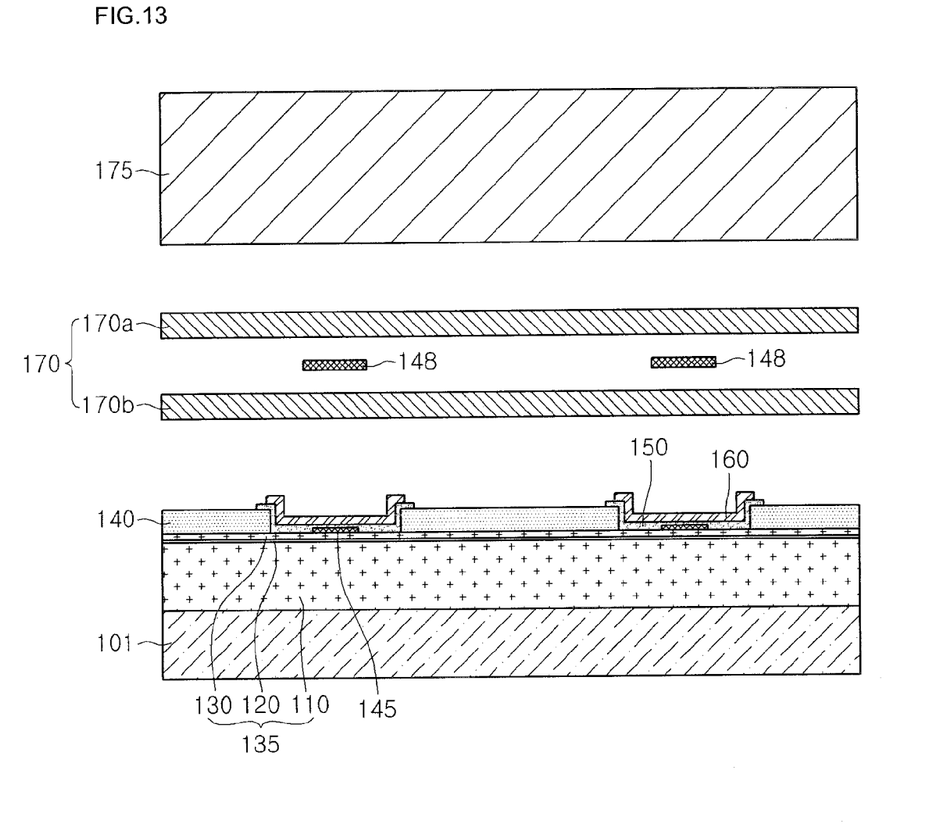

FIGS. 12 and 13 are views for explaining a light emitting device and a method of manufacturing the light emitting device according to a second embodiment.

The light emitting device and the light emitting device manufacturing method of the second embodiment are similar to the light emitting device and the light emitting device manufacturing method of the first embodiment. Thus, the same description as that given in the first embodiment will not be repeated.

The light emitting device of the second embodiment includes a fourth current guide layer 148 in an adhesive layer 170. At least a part of the fourth current guide layer 148 is overlapped with a current blocking layer 145 in a vertical direction.

The fourth current guide layer 148 may be formed of a material having a resistivity of about $5 \times 10^{-4}$ Ωm. For example, the fourth current guide layer 148 may be formed of an electrically insulating material such as ZnO or $SiO_2$. The fourth current guide layer 148 may have a thickness in the range from about 5 nm to about 100 μm, and a width equal to or greater than that of the current blocking layer 145.

The fourth current guide layer 148 may be formed on one of two parts 170a and 170b of the adhesive layer 170, and then the two parts 170a and 170b may be bonded together by such a bonding method as described with reference to FIG. 7 so that the fourth current guide layer 148 can be disposed in the adhesive layer 170.

In the light emitting device of the second embodiment, a third current guide layer 149 (not shown) may be formed in a manner such that the third current guide layer 149 can be overlapped with a protection layer 140 in a vertical direction.

Figure 14:
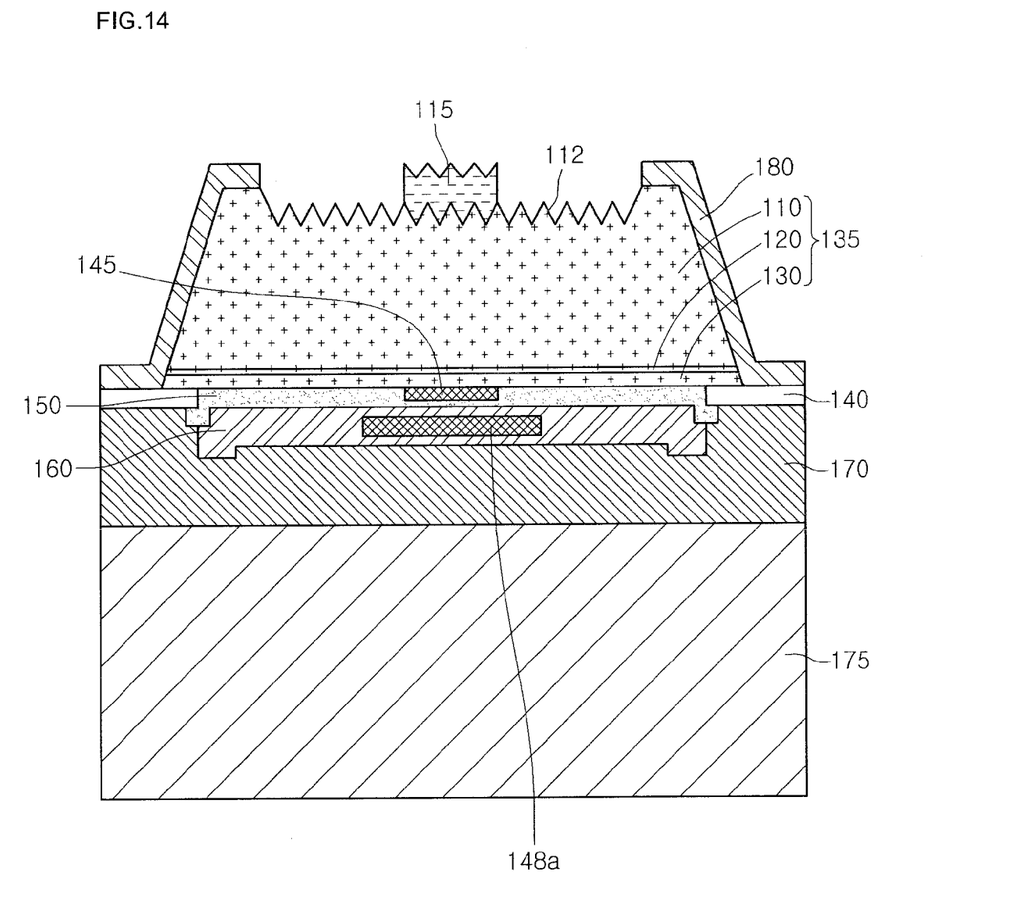
FIG. 14 is a view illustrating a light emitting device according to a third embodiment.

FIG. 14 is a view illustrating a light emitting device according to a third embodiment.

The light emitting device and a light emitting device manufacturing method of the third embodiment are similar to the light emitting devices and the light emitting device manufacturing methods of the first and second embodiments. Thus, the same description as those given in the first and second embodiments will not be repeated.

The light emitting device of the third embodiment includes a fifth current guide layer 148a in a reflection layer 160. At least a part of the fifth current guide layer 148a is overlapped with a current blocking layer 145 in a vertical direction.

The fifth current guide layer 148a may be formed of a material having a resistivity of about $5 \times 10^{-4}$ Ωm. For example, the fifth current guide layer 148a may be formed of an electrically insulating material such as ZnO or $SiO_2$. The fifth current guide layer 148a may have a thickness in the range from about 5 nm to about 100 μm, and a width equal to or greater than that of the current blocking layer 145.

In the third embodiment, the fifth current guide layer 148a may be formed after the reflection layer 160 is partially formed, and then the rest of the reflection layer 160 may be formed so that the fifth current guide layer 148a can be disposed in the reflection layer 160.

In the light emitting device of the third embodiment, a third current guide layer 149 (not shown) may be formed in a manner such that the third current guide layer 149 can be overlapped with a protection layer 140 in a vertical direction like in the light emitting device 100 of the first embodiment shown in FIG. 1.

Figure 16:
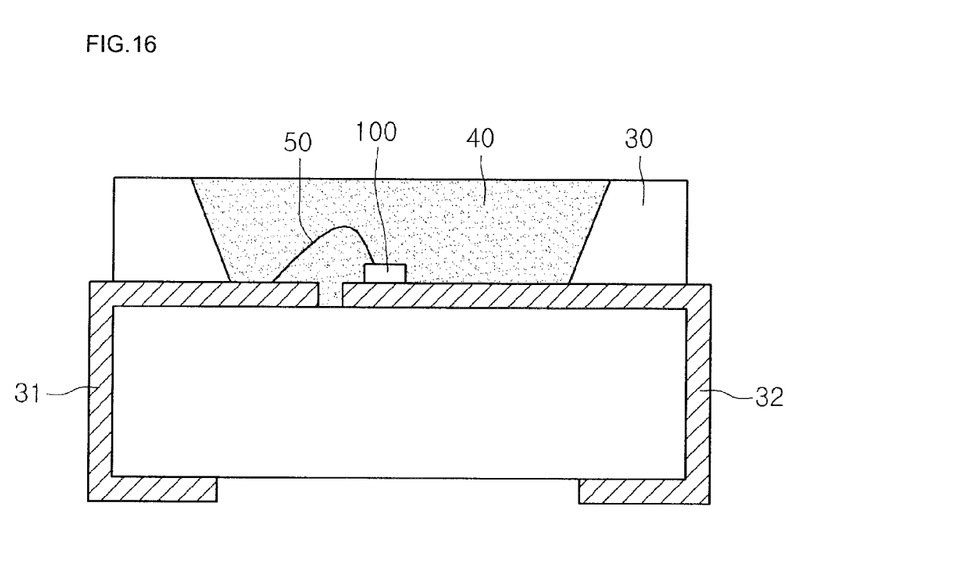
FIG. 16 is a sectional view illustrating a light emitting device package including a light emitting device according to an embodiment.

FIG. 16 is a sectional view of a light emitting device package including a light emitting device according to an embodiment.

Referring to FIG. 16, the light emitting device package of the current embodiment includes: a package body 30; first and second electrode layers 31 and 32 disposed on the package body 30; a light emitting device 100 disposed on the package body 30 and electrically connected to the first and second electrode layers 31 and 32; and a molding member 40 surrounding the light emitting device 100.

The package body 30 may be formed of a silicon material, a synthetic resin material, or a metal material. The package body 30 may include a cavity having a sloped side surface.

The first and second electrode layers 31 and 32 are electrically separated from each other and supply power to the light emitting device 100. In addition, the first and second electrode layers 31 and 32 may reflect light generated in the light emitting device 100 to increase light efficiency and may discharge heat generated in the light emitting device 100 to the outside.

The light emitting device 100 may be disposed on the package body 30 or the first or second electrode layer 31 or 32.

The light emitting device 100 may be connected to the first and second electrode layers 31 and 32 by one of a wire bonding method, a flip chip bonding method, and a die bonding method. In the embodiment, the light emitting device 100 is electrically connected to the first electrode layer 31 through a wire 50 and to the second electrode layer 32 through a direct contact.

The molding member 40 may surround the light emitting device 100 to protect the light emitting device 100. In addition, a phosphor may be contained in the molding member 40 to change the wavelength of light emitted from the light emitting device 100.

In an embodiment, a plurality of light emitting device packages may be arranged on a substrate, and optical members such as a light guide panel, a prism sheet, a diffusion sheet, and a fluorescence sheet may be disposed on a path of light emitted from the light emitting devices. The light emitting device packages, the substrate, and the optical members may be functioned as a backlight unit or a lighting system. Examples of the lighting system include a backlight unit, a lighting unit, an indicating device, a lamp, and a streetlamp.

Figure 17:
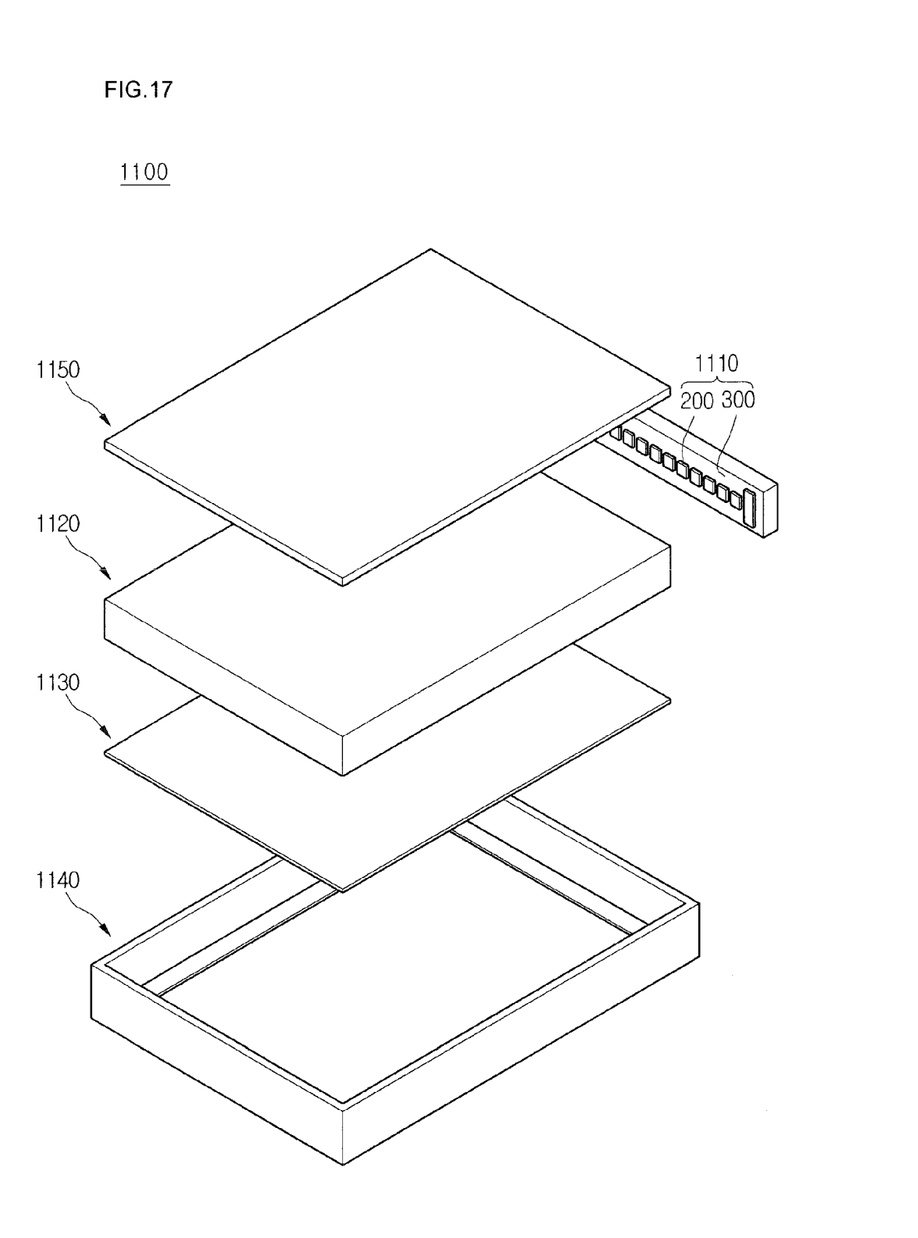
FIG. 17 is a view illustrating a backlight unit including light emitting device packages according to an embodiment.

FIG. 17 is a view illustrating a backlight unit 1100 including light emitting device packages according to an embodiment. The backlight unit 1100 shown in FIG. 17 is an example of lighting systems, and is not limited thereto.

Referring to FIG. 17, the backlight unit 1100 may include a bottom frame 1140, a light guide member 1120 disposed within the bottom frame 1140, and a light emitting module 1110 disposed on at least one side surface or the bottom surface of the light guide member 1120. In addition, a reflection sheet 1130 may be disposed under the light guide member 1120.

The bottom frame 1140 may have a box shape with an opened topside to accommodate the light guide member 1120, the light emitting module 1110, and the reflection sheet 1130. The bottom frame 1140 may be formed of a metal material or a resin material, but is not limited thereto.

The light emitting module 1110 may include a substrate 300 and a plurality of light emitting device packages 200 of the embodiments. The light emitting device packages may be disposed on the substrate. The plurality of light emitting device packages 200 may provide light to the light guide member 1120.

As shown in FIG. 17, the light emitting module 1110 may be disposed on at least one of inner surfaces of the bottom from 1140. Thus, the light emitting module 1110 may provide light toward at least one side surface of the light guide member 1120.

Alternatively, the light emitting module 1110 may be disposed on the bottom surface of the bottom frame 1140 to provide light toward the bottom surface of the light guide member 1120. This may be variously varied according to the design of the backlight unit. That is, the spirit and scope of the present disclosure is not limited thereto.

The light guide member 1120 may be disposed within the bottom frame 1140. The light guide member 1120 may receive light from the light emitting module 1110 and guide the light to a display panel (not shown) as surface light.

For example, the light guide member 1120 may be a light guide panel (LGP). The LGP may be formed of an acryl-based resin such as polymethylmethacrylate (PMMA) or one polyethylene terephthlate (PET), poly carbonate (PC), cyclic olefin copolymer (COC), and polyethylene naphthalate (PEN).

An optical sheet 1150 may be disposed above the light guide member 1120.

For example, the optical sheet 1150 may include at least one of a diffusion sheet, a condensing sheet, a brightness enhancement sheet, and a fluorescence sheet. For example, the optical sheet 1150 may be formed by sequentially stacking such a diffusion sheet, a condensing sheet, a brightness enhancement sheet, and a fluorescence sheet. In this case, the diffusion sheet 1150 may uniformly diffuse light emitted from the light emitting module 1110, and the diffused light may be condensed on the display panel (not shown) by the condensing sheet. Here, light output through the condensing sheet is randomly polarized light. The brightness enhancement sheet may enhance polarization of the light output through the condensing sheet. For example, the condensing sheet may be a horizontal and/or vertical prism sheet. Also, the brightness enhancement sheet may be a dual brightness enhancement film. The fluorescence sheet may be a transparent plate or film including a phosphor.

The reflection sheet 1130 may be disposed under the light guide member 1120. The reflection sheet 1130 may reflect light emitted through the bottom surface of the light guide member 1120 toward a light exit surface of the light guide member 1120.

The reflection sheet 1130 may be formed of a resin material having a high reflectivity such as PET, PC, and PVC resins, but is not limited thereto.

Figure 18:
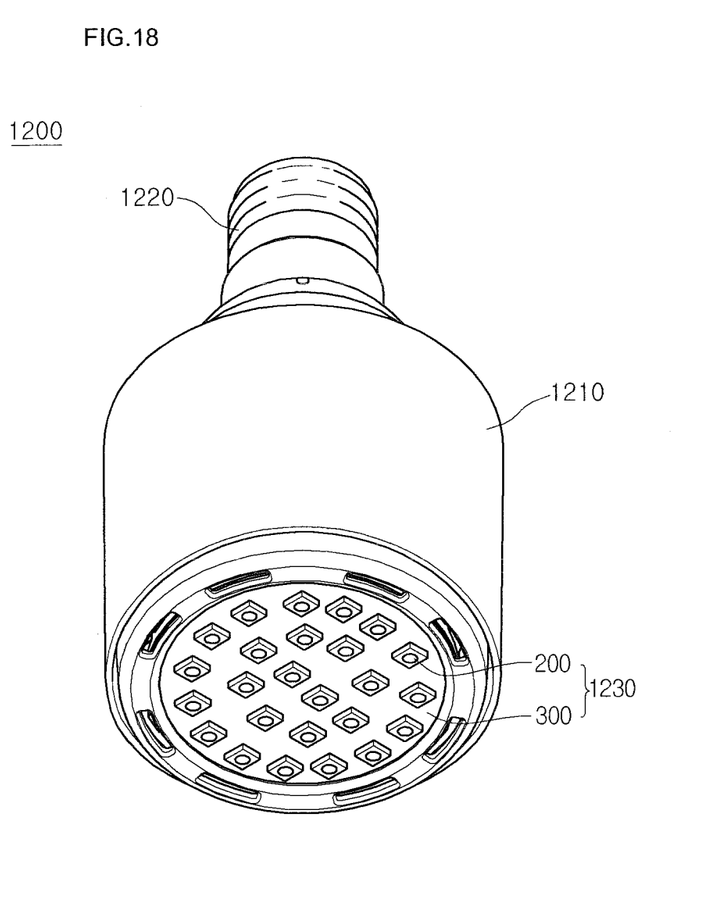
FIG. 18 is a perspective view illustrating a lighting unit including light emitting device packages according to an embodiment.

FIG. 18 is a perspective view illustrating a lighting unit 1200 including light emitting device packages according to an embodiment. The lighting unit 1200 shown in FIG. 18 is an example of lighting systems. However, the spirit and scope of the present disclosure is not limited thereto.

Referring to FIG. 18, the lighting unit 1200 may include a case body 1210, a light emitting module 1230 disposed on the case body 1210, a connection terminal 1220 disposed on the case body 1210 to receive power from an external power source.

The case body 1210 may be formed of a material having good heat dissipation characteristics, such as a metal material or a resin material.

The light emitting module 1230 may include a substrate 300 and at least one light emitting device package 200 mounted on the substrate 300.

The substrate 300 may be a substrate in which circuit patterns are printed on an insulator. Examples of the substrate 300 include a general printed circuit board (PCB), a metal core PCB, a flexible PCB, and a ceramic PCB.

In addition, the substrate 300 may be formed of a material capable of efficiently reflecting light. Alternatively, the substrate 300 may have a surface having a color capable of efficiently reflecting light, such as a white color, or a silver color.

The at least one light emitting device package 200 may be disposed on the substrate 300. The light emitting device package 200 may include at least one light emitting diode (LED). The LED may include a color diode capable of emitting color such as red, green, blue, or white, and an ultraviolet (UV) LED capable of emitting a UV ray.

The light emitting module 1230 may have various combinations of the LEDs to provide color impression and brightness. For example, the light emitting module 1230 may include a combination of a white LED, a red LED, and a green LED to secure a high color rendering index (CRI). Also, a fluorescence sheet may be further disposed on a path of light emitted from the light emitting module 1230. The fluorescence sheet changes the wavelength of the light emitted from the light emitting module 1230. For example, when light emitted from the light emitting module 1230 has a blue wavelength band, the fluorescence sheet may include a yellow phosphor. In this case, light emitted from the light emitting module 1230 may become white light after passing through the fluorescence sheet.

The connection terminal 1220 may be electrically connected to the light emitting module 1230 to supply power. As shown in FIG. 18, the connection terminal 1220 may be screwed and coupled to a socket of an external power source, but is not limited thereto. For example, the connection terminal 1220 may be formed in a pin shape. In this case, the connection terminal 1220 may be inserted into an external power source or connected to the external power source through a cable.

As described above, in the lighting system, at least one of a light guide member, a diffusion sheet, a condensing sheet, a brightness enhancement sheet, and a fluorescence sheet may be disposed on a path of light emitted from the light emitting module 1230 to obtain a predetermined optical effect.

As described above, the lighting system of the embodiment may include the light emitting device of the embodiments to improve reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising: a conductive support substrate; an ohmic contact layer and a current blocking layer on the conductive support substrate; a semiconductor light emitting structure layer on the ohmic contact layer and the current blocking layer; an electrode disposed on the light emitting structure layer, at least a part of the electrode being vertically overlapped with the current blocking layer; and a current guide layer disposed between the current blocking layer and the conductive support substrate, wherein the semiconductor light emitting structure layer includes a second conductive type semiconductor layer, an active layer on the second conductive type semiconductor layer and a first conductive type semiconductor layer on the active layer, wherein a lateral width of the semiconductor light emitting structure layer is greater than a lateral width of the electrode, and wherein the current blocking layer vertically overlaps with both at least the part of the electrode and at least the part of the current guide layer.

2. The light emitting device according to claim 1, further comprising a reflection layer between the current blocking layer and the conductive support substrate.

3. The light emitting device according to claim 2, wherein the current guide layer is disposed in the reflection layer.

4. The light emitting device according to claim 2, further comprising an adhesion layer between the reflection layer and the conductive support substrate.

5. The light emitting device according to claim 1, wherein a horizontal distance between an edge of the current guide layer and an edge of the current blocking layer is greater than a distance between the current guide layer and the current blocking layer.

6. The light emitting device according to claim 1, wherein the current blocking layer includes one of a material less conductive than the ohmic contact layer, a material capable of making Schottky contact with the light emitting structure layer, and an electrically insulating material.

7. The light emitting device according to claim 1, wherein the current blocking layer is disposed on the ohmic contact layer.

8. The light emitting device according to claim 1, wherein a lateral width of the current guide layer is greater than a lateral width of the current blocking layer.

9. The light emitting device according to claim 1, wherein a material of current guide layer is different from a material of the current blocking layer.

10. The light emitting device according to claim 1, wherein the current blocking layer is disposed between the semiconductor light emitting structure layer and the conductive support substrate.

11. A light emitting device comprising: a conductive support substrate; a protection layer disposed on a peripheral region of the conductive support substrate; a semiconductor light emitting structure layer disposed on a part of the protection layer and the conductive support substrate; an adhesion layer under the semiconductor light emitting structure layer and the protection layer; a passivation layer on at least a side surface of the semiconductor light emitting structure layer; and a current guide layer disposed between the conductive support substrate and the protection layer and spaced apart from the protection layer, at least a part of the current guide layer being vertically overlapped with the protection layer, wherein the protection layer is disposed under the passivation layer such that the protection layer is between the passivation layer and the conductive support substrate, and wherein the current guide layer is disposed between the adhesion layer and the conductive su ort substrate.

12. The light emitting device according to claim 11, wherein the protection layer makes physical contact with both the semiconductor light emitting structure layer and the passivation layer.

13. The light emitting device according to claim 11, further comprising an ohmic contact layer disposed between the semiconductor light emitting structure layer and the conductive support substrate and making contact with the light emitting structure layer.

14. The light emitting device according to claim 11, wherein at least a part of the current guide layer is overlapped with a sloped surface of a lateral side of the semiconductor light emitting structure layer in a vertical direction.

15. A light emitting device package comprising: a package body; first and second electrode layers on the package body; and a light emitting diode electrically connected to the first and second electrode layers, wherein the light emitting diode comprises: a conductive support substrate; an ohmic contact layer and a current blocking layer on the conductive support substrate; a light emitting structure layer on the ohmic contact layer and the current blocking layer; an electrode disposed on the light emitting structure layer, at least a part of the electrode being vertically overlapped with the current blocking layer; and a current guide layer disposed between the current blocking layer and the conductive support substrate, wherein the light emitting structure layer includes a second conductive type semiconductor layer, an active layer on the second conductive type semiconductor layer and a first conductive type semiconductor layer on the active layer, wherein a lateral width of the semiconductor light emitting structure layer is greater than a lateral width of the electrode, and wherein the current blocking layer vertically overlaps with both at least the part of the electrode and at least the part of the current guide layer.

16. The light emitting device package according to claim 15, further comprising a reflection layer between the current blocking layer and the conductive support substrate.

17. The light emitting device package according to claim 16, wherein the current guide layer is disposed in the reflection layer.

18. The light emitting device package according to claim 16, further comprising an adhesion layer between the reflection layer and the conductive support substrate.

19. The light emitting device package according to claim 15, wherein the current blocking layer is disposed between the light emitting structure layer and the conductive support substrate.

* * * * *